(12) United States Patent
Wordinger

(10) Patent No.: US 9,356,566 B2
(45) Date of Patent: May 31, 2016

(54) AUDIO AMPLIFIER WITH AN ENHANCED CURRENT LIMITER USING A PROXY SIGNAL

(71) Applicant: Harman International Industries, Inc., Stamford, CT (US)

(72) Inventor: James R. Wordinger, Goshen, IN (US)

(73) Assignee: Harman International Industries, Inc., Stamford, CT (US)

( * ) Notice: Subject to any disclaimer, the term of this patent is extended or adjusted under 35 U.S.C. 154(b) by 125 days.

(21) Appl. No.: 14/164,418

(22) Filed: Jan. 27, 2014

(65) Prior Publication Data

US 2015/0214906 A1  Jul. 30, 2015

(51) Int. Cl.
  *H03F 3/38* (2006.01)
  *H03F 3/185* (2006.01)
  *H03F 3/187* (2006.01)
  *H03F 3/217* (2006.01)

(52) U.S. Cl.
  CPC .............. *H03F 3/185* (2013.01); *H03F 3/187* (2013.01); *H03F 3/2171* (2013.01); *H03F 3/2173* (2013.01); *H03F 3/217* (2013.01); *H03F 3/38* (2013.01); *H03F 2200/03* (2013.01); *H03F 2200/171* (2013.01); *H03F 2200/351* (2013.01); *H03F 2200/462* (2013.01)

(58) Field of Classification Search
  CPC ..... H03F 2200/336; H03F 3/195; H03F 3/24; H03F 1/0222; H03F 1/0227; H03F 1/3241; H03F 2200/102; H03F 2200/555; H03F 1/0261; H03F 1/0277; H03F 1/223; H03F 1/3223; H03F 2200/03; H03F 2200/171; H03F 2200/135; H03F 2200/451; H03F 2203/21106; H03F 3/19; H03F 3/211; H03F 3/217; H03F 1/0211; H03F 1/0238; H03F 2200/375

USPC ...................................... 330/10; 381/120, 121
  See application file for complete search history.

(56) References Cited

U.S. PATENT DOCUMENTS

| | | | | |
|---|---|---|---|---|
| 5,345,165 | A * | 9/1994 | Froeschle | 330/10 |
| 6,064,259 | A * | 5/2000 | Takita | 330/10 |
| 6,809,586 | B1 * | 10/2004 | Hobboosh et al. | 330/10 |
| 7,279,967 | B2 * | 10/2007 | Quilter | 330/10 |
| 7,286,010 | B2 * | 10/2007 | Chieng et al. | 330/10 |

* cited by examiner

*Primary Examiner* — Khanh V Nguyen
(74) *Attorney, Agent, or Firm* — Brooks Kushman P.C.

(57) ABSTRACT

An audio amplifier comprising an input block, a plurality of switches, an output filter, a current monitor and a proxy signal generator is provided. The input block is configured to receive an input signal and to provide a modulated signal. The plurality of switches is configured to generate an audio unfiltered signal including an undesired switching frequency component in response to the modulated signal. The output filter includes a coil and is configured to filter the undesired switching frequency from the audio unfiltered signal. The current monitor is configured to transmit a measurement output including a first operating frequency. The proxy signal generator is configured to provide a proxy signal including a second operating frequency. The input block is further configured to receive the first operating frequency and the second operating frequency to operate in accordance to the first operating frequency and the second operating frequency.

20 Claims, 2 Drawing Sheets

AUDIO AMPLIFIER WITH AN ENHANCED CURRENT LIMITER USING A PROXY SIGNAL

TECHNICAL FIELD

Aspects disclosed herein generally related to an audio amplifier with an enhanced current limiter using a proxy signal.

BACKGROUND

Amplifiers are used to amplify an audio input signal to provide an amplified output signal. Various classes of amplifiers may include Class A, Class B, Class AB, Class C, and Class D. Class A, B, and AB amplifiers are generally considered as analog designs. Class D amplifiers are generally considered as switching designs due to their corresponding switch-mode operation. It is necessary to limit a current function of the class D amplifier, in addition to all other classes of amplifiers, to prevent an output stage from failing if an output from the amplifier is shorted.

SUMMARY

In one embodiment, an audio amplifier comprising an input block, a plurality of switches, an output filter, a current monitor and a proxy signal generator is provided. The input block is configured to receive an input signal and to provide a modulated signal in response to the input signal. The plurality of switches is configured to generate an audio unfiltered signal including an undesired switching frequency component in response to the modulated signal. The output filter includes a coil and is configured to filter the undesired switching frequency from the audio unfiltered signal to generate an audio output signal. The current monitor is electrically coupled to the coil and is configured to transmit a measurement output including a first operating frequency. The proxy signal generator is configured to provide a proxy signal including a second operating frequency. The input block is further configured to receive the first operating frequency and the second operating frequency to operate in accordance to the first operating frequency and the second operating frequency.

In another embodiment, an audio amplifier comprising an input block, a plurality of switches, a coil, a current monitor, and a proxy signal generator is provided. The input block is configured to receive an input signal and to provide a modulated signal in response to the input signal. The plurality of switches is configured to generate an audio unfiltered signal including an undesired switching frequency component in response to the modulated signal. The coil is configured to receive the audio unfiltered signal. The current monitor is electrically coupled to the coil and is configured to transmit a measurement output including a first operating frequency. The proxy signal generator is configured to provide a proxy signal including a second operating frequency. The input block is further configured to receive the first operating frequency and the second operating frequency to operate in accordance to the first operating frequency and the second operating frequency.

In one embodiment, an audio amplifier comprising an input block, a plurality of switches, an output filter, a current monitor and a first filter is provided. The input block is configured to receive an input signal and to provide a modulated signal in response to the input signal. The plurality of switches is configured to generate an audio unfiltered signal including an undesired switching frequency component in response to the modulated signal. The output filter includes a coil and is configured to filter the undesired switching frequency from the audio unfiltered signal to generate an audio output signal. The current monitor is electrically coupled to the coil and is configured to transmit a measurement output including a first operating frequency. The first filter is configured to provide a proxy signal including a second operating frequency. The input block is further configured to receive the first operating frequency and the second operating frequency to operate in accordance to the first operating frequency and the second operating frequency.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
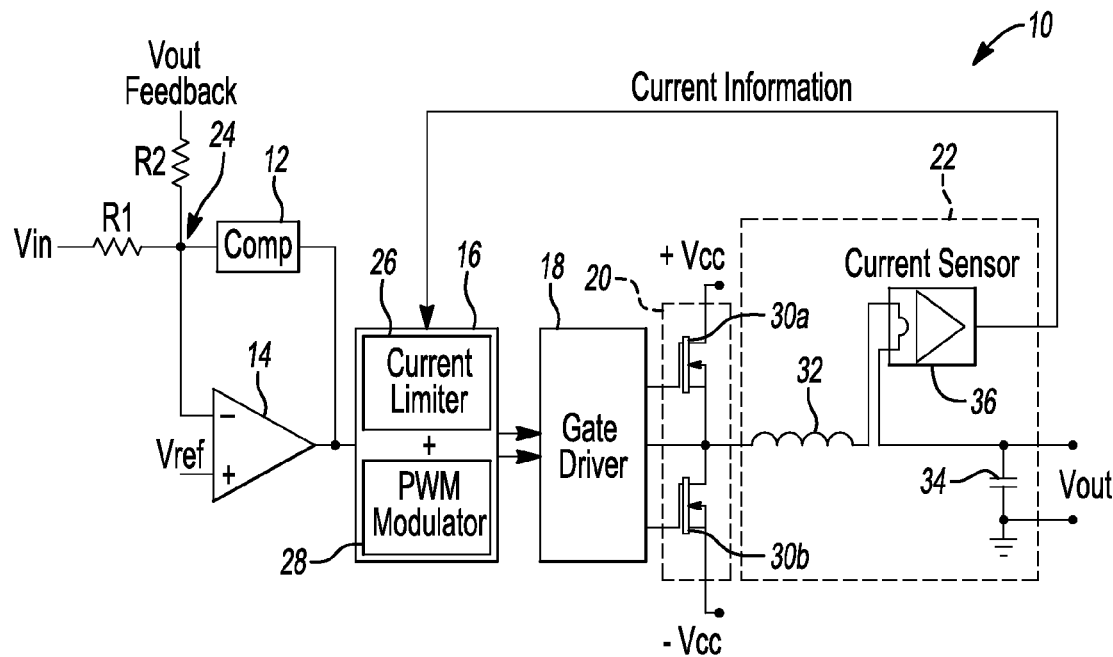
FIG. 1 depicts an audio amplifier.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices, and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein.

The embodiments disclosed herein provide for an audio amplifier with an enhanced current limiter using a proxy signal. The audio amplifier may be implemented in audio systems for providing audio in connection with concert venues (e.g., concert halls, auditoriums, stadiums, etc.), cinema theaters, home theatre systems, etc. Audio amplifiers, such as class D amplifiers, utilize a current limiter to prevent excessive current flow and device failure in an output stage when coupled to a short or low impedance load.

In general, the amplifier includes a plurality of high voltage switches (e.g., FETs, or other suitable switches) that are pulse width modulated in accordance to, or based on, a switching frequency. Because the high voltage switches cycle on and off based on the switching frequency, any attempt to limit a current input by the current limiter may result in spurious signals that are not related to an input signal provided to the amplifier. The spectral content of the spurious signal may damage other parts of the speaker system (e.g., tweeters) or cause nuisance tripping of other protective circuits.

The gain of the current limiter loop is dominated by the resonant frequency of an output filter within the amplifier and the resulting frequency response that is provided back to the current limiter is relatively low. For example, the resulting frequency (of operation) may be in the range of $1/10^{th}$ to $1/5^{th}$ of the nominal switching frequency. This results in a large ripple current that appears at an output of the system, due to the output filter (or low pass filter) being less effective in filtering lower frequency signals. The large current ripple when imposed across a resistor-inductor (RL) load, typical of a loudspeaker, results in a large voltage ripple that may be potentially several hundred volts. This condition can be mitigated if the switching frequency of the high voltage switches can be controlled via a proxy current signal as now disclosed. For example, the proxy current signal aids in increasing the switching frequency of the current limiter such that the switching frequency is not the same as the resonant frequency of the output filter. These features and others will be set forth in more detail below.

FIG. 1 depicts an audio amplifier 10 in accordance to one embodiment. The audio amplifier 10 generally includes a compensation circuit 12, an error amplifier 14, an input block 16, a gate driver 18, a switching block 20, and an output filter 22. A voltage input (Vin) and a voltage output (Vout) are provided to a node 24 and subsequently to both the compensation circuit 12 and to the error amplifier 14. The voltage input (Vin) includes an audio component. The voltage output (Vout) corresponds to an output voltage as provided from the output of the output filter 22. For example, the node 24 provides a node voltage (e.g., the voltage Vin as modified by Vout) to the error amplifier 14. The error amplifier 14 is generally configured to adjust Vin while it is modified by Vout. The error amplifier 14 provides a correction signal (or input signal) to the input block 16 which brings Vin within a desired limit after Vin is modified by Vout.

Specifically, the error amplifier 14 looks at the difference between the Vin and Vout (e.g., as represented by the node voltage) to produce the input signal (or Verr (error voltage)) which is provided to input block 16 (or to a PWM modulator 28 of the input block 16). The error amplifier 14 provides the input signal to the input block 16 to bring Vin within the desired limit and controls the PWM modulator 28. In general, the compensation circuit 12 modifies (or tailors) the gain and phase response of the error amplifier 14 to achieve a desired system open loop response and to satisfy the targeted gain and phase stability margins.

The input block 16 includes a current limiter 26 and a pulse width modulator circuit 28. In general, the input block 16 provides a modulated signal (or PWM signal) for driving a plurality of switches 30a-30b ("30") (e.g., metal oxide field effect transistors (MOSFETs) or other suitable devices). The plurality of switches 30 provide an audio unfiltered output signal in response to the PWM signal. The PWM modulator 28 is configured to generate the PWM signal at, for example, 5 volts, in response to the input signal as provided from the error amplifier 14. The gate driver 18 is generally configured to increase the PWM signal as provided from the PWM modulator 28 into a voltage of, for example, 150V which may be equal to +Vcc and −Vcc (see source voltage in switching block 20). The gate driver 18 increases the PWM signal as provided from the PWM modulator 28 into a voltage that is suitable for activating the plurality of switches 30.

The output filter 22 is configured to remove undesirable frequencies from the audio unfiltered output signal to provide an audio output signal at a voltage waveform Vout at, for example, 1 kHz. The output filter 22 includes a coil 32 and a capacitor 34 for filtering the audio unfiltered output signal. The output filter 22 further includes a current monitor (or sensor) 36 that is in series with the coil 32 for monitoring or sensing an output current of the amplifier 10. The current monitor 36 provides a measurement output that indicates the measured current across the coil 32 to the current limiter 26. In the event the current exceeds an excessive predetermined threshold, the current limiter 26 may shut the PWM modulator 28 down. This condition may occur in the event multiple speakers are coupled to the amplifier 10 or in the event one of more switches 30 experience a short condition or are over stressed. The current limiter 26 is generally configured to sufficiently turn off the PWM modulator 28 and to limit the current to safe levels and to prevent the amplifier 10 from completely shutting down as it is desirable to ensure that the amplifier 10 continues to provide an audio output so long as the current does not exceed safe current levels. In moments where the output current exceeds predefined limits, but not safe current limits, the amplifier 10 will continue to provide an audio output and such an audio output may not be provided under optimal performance. However, this condition ensures that nuisance tripping of the amplifier 10 may be avoided.

The switching block 20 provides the audio unfiltered output signal at a voltage waveform that is nearly a square wave at high amplitude, for example, +/−150 V. The audio unfiltered output signal at the coil 32 includes an audio band component (e.g., the desired audio band at, for example, 1 kHz) and an undesired switching frequency component (e.g., a frequency that is around 384 kHz and may be an integer multiple thereof). The undesired switching frequency component present at the coil 32 is a small ripple current that corresponds to the switching frequency (e.g., 384 kHz) used to cycle the plurality of switches 30 (via the PWM signal) on/off. The undesired switching frequency component may include side band frequencies around 384 kHz and are weighted by Bessel functions, similar to amplitude modulation (AM).

As noted above, the output filter 22 is configured to remove the undesired frequencies (or the undesired switching frequency component) from the audio unfiltered output signal to provide the audio output signal. The coil 32 and the capacitor 34 remove the undesired switching frequency component while allowing the audio band component to pass therethrough. As shown, the current monitor 36 is in series with the coil 32. In this case, the current monitor 36 receives (or sees) the current that flows through the coil 32 which includes the audio band component (e.g., the 1 kHz audio based component) and the undesired switching frequency component (e.g., the 384 KHz switching frequency component). The current monitor 36 is not ideal and has a limited bandwidth. As such, while the current monitor 36 may provide an indication as to the amount of current flowing from the coil 32 (e.g., see signal Current Information as output from the current monitor 36), the current monitor 36 may not provide the high switching frequency information (e.g., 384 kHz) to the current limiter 26. It is generally desirable for the current limiter 26 to use high frequency information for operation. For example, because the current monitor 36 is bandwidth limited, it may only provide 50 kHz of the 384 kHz of frequency information to the current limiter 26. In this case, the operating frequency of the current limiter 26 is low which affects the gain of the current limiter 26 as provided to the PWM modulator 28. Such a low operating frequency additionally affects the switching frequency of the switches 30. For example, the 50 kHz operating frequency of the current limiter 26 resembles the resonant operating frequency of the output filter 22. In general, the current monitor 36 reports the current flow through the coil 32. Since the resonant frequency of the output filter 22 (e.g., the coil 32, the capacitor 34 along with additional RC components) is 50 kHz, there is a preponderance of 50 kHz information that is provided to the current limiter 26.

In this case, the gain of the current limiter 26 is dominated by the resonant frequency of the output filter 22 which causes a relatively low operating frequency of the current limiter 26. This condition may result in a large ripple current that appears at an output of the amplifier 10 that is generally not desirable. It should be noted that the power rating of various high frequency loudspeakers (e.g., tweeters) coupled to the amplifier is rather limited. It is desirable to prevent the larger ripple current (or excessive power) from flowing to the tweeters during current limiting events. It is also desirable to limit the high frequency power provided from the amplifier 10. By shifting the frequency of operation to a higher frequency, the output filter 22 may more effectively attenuate the output of the current limiter 26 and reduce stress applied to the tweeters during current limiting events while achieving the needed stress reduction to the switches 30. The ripple current during current limiting is reduced when the current limiting occurs at a higher frequency due to better attenuation of the output filter 22.

It is desirable to provide an adequate switching frequency amount to the current limiter 26 to move the switching frequency of the current limiter 26 away from the resonant frequency of the output filter 22 for the reasons noted above. In particular, it may be desirable to provide a switching frequency of, for example, at least 100 kHz (or even up to 384 kHz) from the output of the current monitor 36 along with information corresponding to the current measured across the coil 32 (e.g., see signal Current Information in FIG. 1) to the current limiter 26. This increased amount of switching frequency moves the switching frequency of the current limiter 26 away from the resonant operating frequency of the output filter 22.

Figure 2:
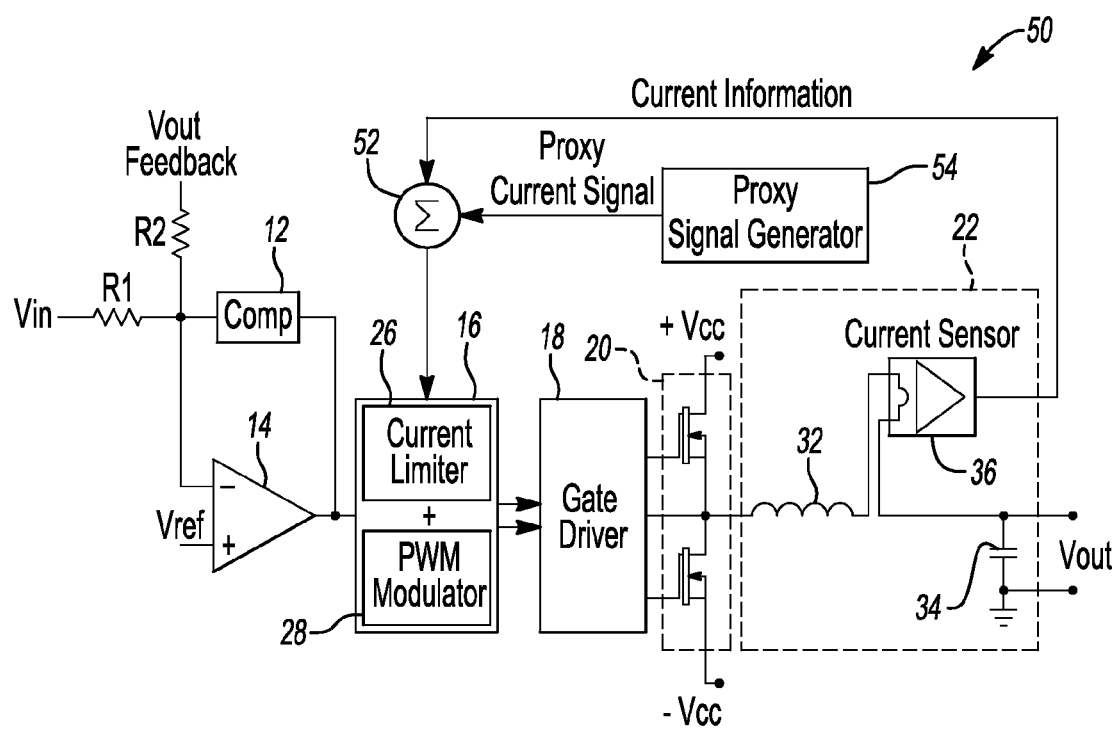
FIG. 2 depicts an audio amplifier in accordance to one embodiment.

FIG. 2 depicts an audio amplifier 50 in accordance to one embodiment. The audio amplifier 50 includes a summer circuit 52 and a proxy signal generator 54. The proxy signal generator 54 is generally configured to provide a proxy current signal (or proxy signal) to the summer circuit 52. The proxy current signal may include an amount of current (or a voltage that is representative of the amount of current while utilizing a scale factor) that is generally smaller than the current of the output from the current monitor 36. For example, the proxy current signal may be 10% of the amplitude of the output from the current monitor 36, but includes a higher frequency component than that provided by the current monitor 36.

The proxy signal generator 54 may include any number of components for providing the proxy current signal. For example, the proxy signal generator 54 may include at least a portion of a microprocessor (not shown) that generates a clock signal, a phase shifted clock signal or other suitable signal which again may be 10% of the amplitude in reference to the amplitude of the output from the current monitor 36 and that may provide an operating frequency of, for example, 200 kHz. The proxy signal generator 54 may also include a filter that provides the proxy current signal.

It is recognized that the proxy current signal may be at a switching frequency of, for example, 384 kHz, or some other frequency that is possibly half of the switching frequency so long as the proxy current signal provides a frequency that is well above the resonant frequency of the output filter 22. The summer circuit 52 may add the proxy current signal to the output of the current monitor 36. The summer circuit 52 entrains (or synchronizes) the operating frequency as provided on the proxy current signal (e.g., at least 100 kHz) with the operating frequency as provided from the output of the current monitor 36 (e.g., 50 kHz) to provide a final operating frequency. The summer circuit 52 provides the final operating frequency on a frequency control signal to the current limiter 26.

The current limiter 26 operates at the operating frequency as provided from the frequency control signal. In this case, the current limiter 26 operates at an operating frequency that is greater than the resonant frequency of the output filter 22. This condition may prevent large amplitude voltages from being present at the amplifier output and/or reduce excessive switching losses with the switches 30. Additionally, the audio output signal (e.g., the output voltage waveform from the amplifier 10) is better behaved when the operating frequency of the current limiter 26 is increased. For example, the reduced high frequency signal amplitude may result in less power being delivered into the high frequency drivers (e.g., tweeters), thus reducing the risk of damage.

Figure 3:
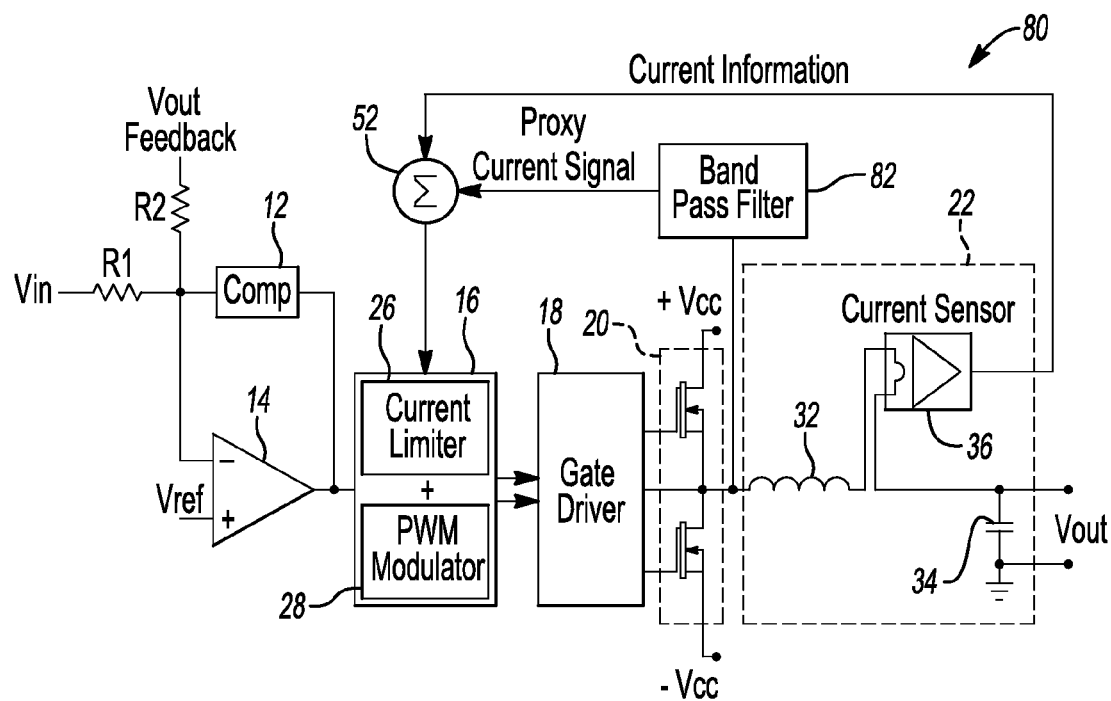
FIG. 3 depicts an audio amplifier in accordance to another embodiment.

FIG. 3 depicts an audio amplifier 80 in accordance to another embodiment. The audio amplifier 80 includes the proxy signal generator 54 as implemented as a band pass filter 82. The band pass filter 82 is configured to provide the proxy current signal to the summer circuit 52. In general, the band pass filter 82 receives the audio unfiltered output signal from the switching block 20. As noted above, the audio unfiltered output signal may be a +/−150 Vpk square wave at 384 kHz. A center frequency for the band pass filter 82 may be below the operating frequency of 384 kHz. For example, the center frequency may be 100 kHz. The center frequency for the band pass filter 82 may roll off at −20 dB decade above the center frequency. In this case, the band pass filter 82 generates a triangle waveform in response to receiving the square wave that rolls off at −20 dB/decade. It is recognized that the proxy current signal generator 54 may provide a waveform at any number of shapes (e.g., sine, square, triangle, ramps, and/or any combination of the foregoing). In general, the square waveform of the audio unfiltered output signal includes a frequency component at the fundamental frequency (e.g., 384 kHz) and also at odd integer multiples of the fundamental frequency (e.g., 3×384 kHz, 5×384 kHz, 7×384 kHz, etc.).

Generally, these frequencies are absent in current reading (or the signal Current Information) as provided by the current monitor 36 until such frequencies as provided by the proxy current signal are added to the current reading. In the frequency domain, the current monitor 36 has a limited bandwidth. As such, the harmonics of the fundamental frequency (e.g., 1×384 kHz, 3×384 kHz, 5×384 kHz, 7×384 kHz, etc.) are not passed to the current limiter 26. The summer circuit 52 adds the triangular characteristics of the waveform (on the proxy current signal) to the output of the current monitor 36 which improves the apparent frequency response of the output of the current monitor 36.

In general, the measurement output of the current monitor 36, in the time domain, is rounded off and lacks crisp peaks due to the current monitor 36 acting as a low pass filter. The addition of the triangular peaks to the output of the current monitor 36 provides peaks that are crisper. Thus, this condition improves the apparent frequency response of the output of the current monitor 36. Additionally, the output filter 22 is to filter out the switching frequency and harmonics on the audio unfiltered output signal and to pass through the audio components. As noted above, the output filter 22 is a low pass filter and is not perfect (i.e., not a brick wall filter). The performance of the low pass filter improves when the frequencies are higher. Thus, by increasing the operating frequency of the current limiter 26 via the proxy current signal, this condition enables the low pass filter to achieve better performance in the current limiter mode.

Figure 4:
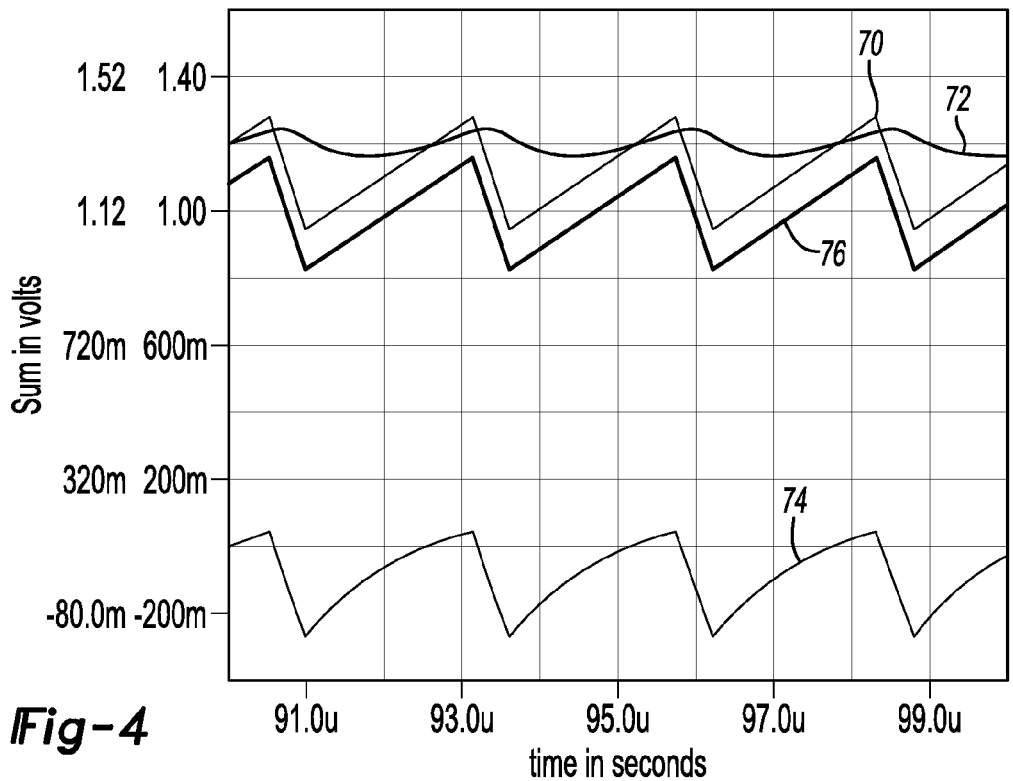
FIG. 4 depict various waveforms that are generated by various features of the audio amplifier in accordance to one embodiment.

FIG. 4 depicts various waveforms that are generated by various features of the audio amplifier 10 in accordance to one embodiment. For example, first waveform 70 depicts the current that flows through the coil 32. Second waveform 72 depicts the measurement output of the current monitor 36. As shown, the second waveform 72 provides for a good direct current (DC) response but lacks crisp edges due to bandwidth limitations of the current monitor 36. Third waveform 74 depicts the proxy current signal as provided by the proxy signal generator 54. As shown, the third waveform 74 does not include a DC component. However, the third waveform 74 exhibits a good high frequency response. Fourth waveform 76 depicts the output from the summer circuit 52 that is provided to the current limiter 26. As shown, the fourth waveform 76 is generally triangular and exhibits a good frequency response. The fourth waveform 76 includes spectral components that are generally lacking in the second waveform 72. As noted above, the third waveform 74 (e.g., the proxy current signal) provides such spectral components in the fourth waveform 76. The higher frequency components of the fourth waveform 76 enable a current limiter operation at a higher frequency due to the entrainment process or operation.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio amplifier comprising:
an input block configured to receive an input signal and to provide a modulated signal in response to the input signal;
a plurality of switches being configured to generate an audio unfiltered signal including an undesired switching frequency component in response to the modulated signal;
an output filter including a coil and being configured to filter the undesired switching frequency component from the audio unfiltered signal to generate an audio output signal;
a current monitor being electrically coupled to the coil and being configured to transmit a measurement output including a first operating frequency; and
a proxy signal generator configured to provide a proxy signal including a second operating frequency,
wherein the input block is further configured to receive the first operating frequency and the second operating frequency to operate in accordance to the first operating frequency and the second operating frequency, and
wherein the measurement output further includes current information indicative of an amount of current flowing through the coil in response to the coil receiving the audio unfiltered signal.

2. The audio amplifier of claim 1 further comprising a summer circuit for entraining the first operating frequency and the second operating frequency with one another to provide a final operating frequency to the input block.

3. The audio amplifier of claim 2 wherein the output filter is further configured to operate at a resonant frequency and wherein the final operating frequency is greater than the resonant frequency.

4. The audio amplifier of claim 1 wherein the input block includes a current limiter configured to receive the measurement output to limit operation of the audio amplifier based on an amount of current flowing through the coil.

5. The audio amplifier of claim 1 wherein the proxy signal generator includes a first filter configured to provide the proxy signal in response to the audio unfiltered signal.

6. The audio amplifier of claim 5 wherein the first filter is a band pass filter.

7. The audio amplifier of claim 1 wherein the proxy signal generator includes a microprocessor configured to provide the proxy signal as one of a clock signal and a phase shifted clock signal.

8. An audio amplifier comprising:
an input block configured to receive an input signal and to provide a modulated signal in response to the input signal;
a plurality of switches being configured to generate an audio unfiltered signal including an undesired switching frequency component in response to the modulated signal;
a coil configured to receive the audio unfiltered signal;
a current monitor being electrically coupled to the coil and being configured to transmit a measurement output including a first operating frequency in response to the coil receiving the audio unfiltered signal; and
a proxy signal generator configured to provide a proxy signal including a second operating frequency,
wherein the input block is further configured to receive the first operating frequency and the second operating frequency to operate in accordance to the first operating frequency and the second operating frequency, and
wherein the input block includes a current limiter configured to receive the measurement output to limit operation of the audio amplifier based on an amount of current flowing through the coil.

9. The audio amplifier of claim 8 further comprising an output filter including the coil and being configured to filter the undesired switching frequency component from the audio unfiltered signal to generate an audio output signal.

10. The audio amplifier of claim 9 further comprising a summer circuit for entraining the first operating frequency and the second operating frequency with one another to provide a final operating frequency to the input block.

11. The audio amplifier of claim 10 wherein the output filter is further configured to operate at a resonant frequency and wherein the final operating frequency is greater than the resonant frequency.

12. The audio amplifier of claim 8 wherein the measurement output further includes current information indicative of an amount of current flowing through the coil in response to the coil receiving the audio unfiltered signal.

13. The audio amplifier of claim 8 wherein the proxy signal generator includes a filter configured to provide the proxy signal in response to the audio unfiltered signal.

14. The audio amplifier of claim 8 wherein the proxy signal generator includes a microprocessor configured to provide the proxy signal as one of a clock signal and a phase shifted clock signal.

15. An audio amplifier comprising:
an input block configured to receive an input signal and to provide a modulated signal in response to the input signal;
a plurality of switches being configured to generate an audio unfiltered signal including an undesired switching frequency component in response to the modulated signal;
an output filter including a coil and being configured to filter the undesired switching frequency component from the audio unfiltered signal to generate an audio output signal;
a current monitor being electrically coupled to the coil and being configured to transmit a measurement output including a first operating frequency; and
a first filter configured to provide a proxy signal including a second operating frequency,
wherein the input block is further configured to receive the first operating frequency and the second operating frequency to operate in accordance to the first operating frequency and the second operating frequency, and
wherein the measurement output further includes current information indicative of an amount of current flowing through the coil in response to the coil receiving the audio unfiltered signal.

16. The audio amplifier of claim 15 further comprising a summer circuit configured to synchronize the first operating frequency and the second operating frequency with one another to provide a final operating frequency to the input block.

17. The audio amplifier of claim 16 wherein the output filter is further configured to operate at a resonant frequency and wherein the final operating frequency is greater than the resonant frequency.

18. An audio amplifier comprising:
an input block configured to receive an input signal and to provide a modulated signal in response to the input signal;
a plurality of switches being configured to generate an audio unfiltered signal including an undesired switching frequency component in response to the modulated signal;
an output filter including a coil and being configured to filter the undesired switching frequency component from the audio unfiltered signal to generate an audio output signal;
a current monitor being electrically coupled to the coil and being configured to transmit a measurement output including a first operating frequency; and
a proxy signal generator configured to provide a proxy signal including a second operating frequency,
wherein the input block is further configured to receive the first operating frequency and the second operating frequency to operate in accordance to the first operating frequency and the second operating frequency, and
wherein the input block includes a current limiter configured to receive the measurement output to limit operation of the audio amplifier based on an amount of current flowing through the coil.

19. An audio amplifier comprising:
an input block configured to receive an input signal and to provide a modulated signal in response to the input signal;
a plurality of switches being configured to generate an audio unfiltered signal including an undesired switching frequency component in response to the modulated signal;
an output filter including a coil and being configured to filter the undesired switching frequency component from the audio unfiltered signal to generate an audio output signal;
a current monitor being electrically coupled to the coil and being configured to transmit a measurement output including a first operating frequency; and
a proxy signal generator configured to provide a proxy signal including a second operating frequency,
wherein the input block is further configured to receive the first operating frequency and the second operating frequency to operate in accordance to the first operating frequency and the second operating frequency, and
wherein the proxy signal generator includes a microprocessor configured to provide the proxy signal as one of a clock signal and a phase shifted clock signal.

20. An audio amplifier comprising:
an input block configured to receive an input signal and to provide a modulated signal in response to the input signal;
a plurality of switches being configured to generate an audio unfiltered signal including an undesired switching frequency component in response to the modulated signal;
a coil configured to receive the audio unfiltered signal;
a current monitor being electrically coupled to the coil and being configured to transmit a measurement output including a first operating frequency in response to the coil receiving the audio unfiltered signal; and
a proxy signal generator configured to provide a proxy signal including a second operating frequency,
wherein the input block is further configured to receive the first operating frequency and the second operating frequency to operate in accordance to the first operating frequency and the second operating frequency, and
wherein the measurement output further includes current information indicative of an amount of current flowing through the coil in response to the coil receiving the audio unfiltered signal.

* * * * *